United States Patent [19]
Williams et al.

[11] Patent Number: 4,930,634
[45] Date of Patent: Jun. 5, 1990

[54] CARRIER FOR FLAT PANEL DISPLAYS

[75] Inventors: Randall S. Williams; Michael D. Peterson, both of Chaska; Robert J. Nentl, Lakeville, all of Minn.

[73] Assignee: Fluoroware, Inc., Chaska, Minn.

[21] Appl. No.: 322,728

[22] Filed: Mar. 13, 1989

Related U.S. Application Data

[63] Continuation-in-part of Ser. No. 102,166, Sep. 29, 1987, Pat. No. 4,815,601.

[51] Int. Cl.[5] .............................................. B65D 85/48
[52] U.S. Cl. .................................................. 206/454
[58] Field of Search ............... 206/449, 454, 455, 456; 211/41

[56] References Cited

U.S. PATENT DOCUMENTS

| D. 221,688 | 8/1971 | Elsfelder . | |
|---|---|---|---|
| 1,764,754 | 6/1930 | Scott . | |
| 1,885,691 | 11/1932 | Dressler . | |
| 2,019,722 | 11/1935 | Neumeyer | 224/48 |
| 2,156,955 | 5/1939 | Page | 129/16 |
| 2,194,828 | 3/1940 | Greaves | 312/92 |
| 2,407,021 | 9/1946 | Langel | 220/23.2 |
| 2,453,030 | 11/1948 | Newman | 211/49 |
| 2,676,729 | 6/1958 | Neville, Jr. et al. | 220/71 |
| 2,729,375 | 1/1956 | Pace | 226/14 |
| 2,774,472 | 12/1956 | Badalich | 206/62 |
| 2,813,633 | 11/1957 | Welling | 211/41 |
| 2,840,256 | 6/1958 | Cobb, Jr. | 220/71 X |
| 3,160,283 | 12/1964 | LaChance | 211/184 |
| 3,294,271 | 12/1966 | Armbruster | 220/71 X |
| 3,348,721 | 10/1967 | Trevarrow, Jr. | 220/71 X |
| 3,365,070 | 1/1968 | Miles | 211/126 |
| 3,394,819 | 7/1968 | Saville | 211/126 |
| 3,442,395 | 5/1969 | Taylor | 211/41 |
| 3,467,242 | 9/1969 | De Rousse | 206/1 |
| 3,473,670 | 10/1969 | Elftmann | 211/41 |
| 3,480,151 | 11/1969 | Schmitt | 211/41 |

(List continued on next page.)

FOREIGN PATENT DOCUMENTS 0028266 5/1980 European Pat. Off. .
88/0072 2/1988 PCT Int'l Appl. .
1334330 10/1973 United Kingdom .
1571306 12/1976 United Kingdom .

OTHER PUBLICATIONS

Michael L. Osgar Patent Application for Welding Fluoropolymer Pipe and Fittings; Ser. No. 628,784, filed 7/9/84.

(List continued on next page.)

Primary Examiner—William Price
Attorney, Agent, or Firm—Palmatier & Sjoquist

[57] ABSTRACT

A strong and rigid carrier of substantial size fabricated of melt processible plastic for flat glass panels being processed for use in flat panel displays. The carrier has a pair of light weight but rigid and strong end walls in confronting and spaced relation to each other. Each end wall has a periphery thereabout and central ribs with an inclined panel adjoining the central ribs and traversing the height of the central ribs. Outwardly extending mounting flanges adjoin the periphery with a multiplicity of annular bosses protruding inwardly from the flanges. Large openings are in the end walls to allow machine and fluid processing access to the glass panel within the carrier. The carrier has a front open side and two sidewalls in confronting and spaced relation. The sidewalls each have a multiplicity of elongate sidewall segments each preferably being tubular and oblong in cross section or having portions which extend transversely and obliquely of the peripheries of each end wall. This construction further adds strength and rigidity to the carrier. The sidewall segments have end portions that extend to and are welded to the adjacent annular bosses of the adjacent end wall flanges. The side wall segments also have glass panel supporting and spacing ribs facing inwardly. A back wall is provided having a multiplicity of melt processible plastic tubular rails in spaced relation from each other, each extending between and welded to the adjacent annular bosses of the back wall flanges to confine the glass panels witin the carrier.

33 Claims, 9 Drawing Sheets

U.S. PATENT DOCUMENTS

| | | | |
|---|---|---|---|
| 3,486,631 | 12/1969 | Rodman | 211/41 |
| 3,487,943 | 1/1970 | Haidegger | 211/71 |
| 3,498,597 | 3/1970 | Roberts et al. | 263/49 |
| 3,501,047 | 3/1970 | Raabe | 220/71 |
| 3,534,862 | 10/1970 | Shambelan | 211/11 |
| 3,645,581 | 2/1972 | Lasch, Jr. et al. | 302/2 R |
| 3,682,083 | 8/1972 | Puente | 211/41 |
| 3,701,558 | 10/1972 | Baker | 294/33 |
| 3,737,282 | 6/1973 | Hearn et al. | 432/6 |
| 3,819,076 | 6/1974 | Oehler | 214/512 |
| 3,828,726 | 8/1974 | Dietze et al. | 118/500 |
| 3,850,296 | 11/1974 | Hirata et al. | 206/334 |
| 3,923,156 | 12/1975 | Wallestad | 206/454 |
| 3,923,191 | 12/1975 | Johnson | 220/94 R |
| 3,926,305 | 12/1975 | Wallestad | 206/73 |
| 3,930,684 | 1/1976 | Lasch, Jr. et al. | 302/2 R |
| 3,939,973 | 2/1976 | Wallestad | 206/328 |
| 3,947,236 | 3/1976 | Lasch, Jr. | 432/11 |
| 3,961,877 | 6/1976 | Johnson | 432/253 |
| 4,043,451 | 8/1977 | Johnson | 206/334 |
| 4,081,099 | 3/1978 | Shead | 220/71 |
| 4,450,960 | 5/1984 | Johnson | 206/334 |
| 4,471,716 | 9/1984 | Milliren | 118/500 |
| 4,493,418 | 1/1985 | Johnson | 206/454 |
| 4,508,990 | 2/1985 | Essinger | 313/50 |
| 4,511,599 | 4/1985 | Rustomji | 427/66 |
| 4,515,104 | 5/1985 | Lee | 118/500 |
| 4,520,925 | 6/1985 | Johnson | 206/334 |
| 4,557,382 | 12/1985 | Johnson | 206/444 |
| 4,559,535 | 12/1985 | Watkins | 340/793 |
| 4,570,151 | 2/1986 | Martorano et al. | 340/52 R |
| 4,584,786 | 4/1986 | Georgopulos | 40/448 |
| 4,602,189 | 7/1986 | Panicker | 313/505 |
| 4,613,793 | 9/1986 | Panicker et al. | 315/169.3 |
| 4,679,689 | 7/1987 | Blome | 206/334 |

OTHER PUBLICATIONS

1974 Silicon Technology Corporation, Bulletin 4102, "Production Information STC Wafer Baskets".
Dec. 1985; Emerson Plastronics; "Silicon Wafer Handling System", Spin Dryer for Silicon-Wafers.
Fluoroware 1987 Catalog.
Ind. Modular Systems Corp.1 1971; "Loader/Unloader and Sender/Receiver", 6100 Series.
IBM Technical Disclosure Bulletin; vol. 8, No. 11, Apr. 1966; "Wafer Package" by L. Hershoff.
IBM Technical Disclosure Bulletin, vol. 14, No. 10, Mar. 1972.
Emerson Plastronics, Inc.; 12/85; "Throw Away Your Tweezers", pp. 1-3.
Indus. Modular Sys. Corp.; 1971; "Wafer Carriers".
Peninsula Electronics; Mar. 1971; "Automated Application of Photoresist Coatings . . . ".
"Engineering Plastics and Their Commercial Development", Adv. in Chemistry Series 96; Am. Chem. Soc.; 1969.
"Engineering Guide to Phenolic Plastics"; Materials Engineering; Jun. 1971.
"How to Avoid Warpage Problems in Injection Molded Parts", Plastics Design and Processing; Jan. 1974.
"Fluoropolymers Now Are Tougher and Easier to Process", Materials Engineering; Aug. 1972.
"Versatile Engineering Thermoplastic Combines Dimensional Stability Resistance to Heat and Water", Materials Engineering, 1971.
Plastic Mold Engineering, ed., DuBois and Pribble Reinhold Publishing Corporation; pp. 71, 76-77.
"Plastics Technology, Basic Materials and Processes", R. S. Swanson; McKnight Publ. Co., 1965; pp. 157-158, 166.
"Engineering Design for Plastics", Ed. by E. Baer; Reinhold Pub. Corp.; 1964; pp. 1155, 1159, 1171-1173.
"Fundamentals of Tool Design"; Am. Soc. of Tool and Manufacturing Engineers, 1962; pp. 299-300.
"Engineering Data for Product Design", Greenwood; McGraw-Hill Book Co., Inc., 1961; pp. 2, 20.
"Plastic Engineering Handbook"; Society of the Plastics Industry, Inc., 3d. Ed., 1960; Reinhold Pub. Corp., pp. 301-302, 286.
"Dictionary of Terms Parts I and II"; Horner; The Technical Press, London, 8th Ed., 1960; pp. 168, 287.
"Machinery's Handbook", 16th Ed., 1959; pp. 348-410.
"Plastic Engineering Handbook", The Soc. of the Plastics Industry, Inc., Reinhold Pub.; 1954; pp. 421-425.
"Structural Design in Metals", Williams & Harris; McGraw-Hill Book Co., Inc., 1948; pp. 96-97.
"Elementary Structural Analysis"; Wilbur & Norris; McGraw-Hill Book Company, Inc., 1948; pp. 14-15.

(List continued on next page.)

OTHER PUBLICATIONS

"The Production of Plastics", Kaye; International Textbook Company; 1947; pp. 317, 330–331.
"An Introduction of Engineering Plastics", Brown & Harris, Murray Hill Books, Inc., 1947.
"Applied Plastic Product Design", Davis and Beck; Prentice-Hall, 1946, pp. 48–53.
"Plastics Handbook for Product Engineers", Sasso; McGraw-Hill Book Co., Inc., 1946; pp. 311, 344–345.
"Handbook of Plastics", Simonds & Ellis; Van Nostrand Company, Inc., Aug. 1943; pp. 843, 855.
"Industrial Plastics"; Simonds; Pitman Publishing Corp.; 1939; pp. 286–287; 308–309.
"Hutchinson's Technical Scientific Encyclopedia", Ed. by Tweeney & Shirshov; vol. II; McMillan Co.; 1935; p. 1214.
"Plastic Design", Plastics World, 1972; p. 31.
"Structural Foam in Your Future? It's Closer than You Think!", Plastics World, Apr. 1972, pp. 40–44.
"Sign Savvy Lies Behind Attractive Moldings", Plastics Design, May 1971; pp. 27–28.
"Designers: Remember These FRTP Basics", Plastics World, May 1971; pp. 62–63.
"Plastic Design; Ideas from the Design Board", Plastics World; 1973; p. 31.
"Plastic Production Design", Beck; Van Nostrand Reinhold Company; 1970; pp. 18–21; 89–185; 345–361.
"Modern Industrial Plastics", Richardson; Howard W. Sams & Co., Inc., 1974; pp. 116–126.
"Tool Engineers Handbook", 1959; pp. 47-9–47.11.
"Design Guidelines for Injection-Molded FEP Parts", Journal of Teflon; Apr. 1966; vol. 7, No. 3, pp. 1–5.
"How to Avoid Warpage Problems in Injection Molded Parts", 1974, Plastics Design & Processing, pp. 25–27.

CARRIER FOR FLAT PANEL DISPLAYS

BACKGROUND OF THE INVENTION

This carrier for flat panel displays is an improvement over the carrier disclosed and claimed in copending U.S. Pat. application Ser. No. 102,166, filed Sept. 29, 1987, now U.S. Pat. No. 4,815,601 and this application is a continuation-in-part of said application which is under common ownership with this application.

In the manufacturing of flat panel displays, a panel of glass or other similar material will have numerous layers or coatings deposited thereon and stacked one upon another. The coatings are of widely different natures and act together to produce images which are visible through the glass panel. Certain of the layers of materials deposited on the glass substrate require high heat processing with temperatures in the range of 165° C. to 180° C. being commonly encountered; and other materials are subjected to strong chemicals such as acid in etching processes.

The coatings or deposited films are extremely thin, and on the order of 2,000 to 6,500 Angstroms in thickness. The various materials which are deposited on the face of the glass substrate may include metal vapor to provide a high resolution back metal electrode with a thickness of about 1,000 Angstroms; a transparent layer of Indium Tin Oxide with a thickness of approximately 1,700 Angstroms; a transparent dielectric layer, or yttria layer with a thickness of approximately 2,000 Angstroms; a transparent light generating phosphor layer, which may be zinc sulfide doped with manganese, with a thickness of about 6,000 Angstroms; a light emission enhancing layer, such as tantalum pentoxide, with a thickness of approximately 200 Angstroms; a light sink or light absorbing layer of a semiconductor compound with a thickness of about 2,500 Angstroms; and an aluminum electrode layer formed into conductive strips with a thickness of about 1,200 Angstroms; and possibly an amorphous silicon layer and other miscellaneous electrodes and connectors.

Flat panel displays, being used as substitutes for cathode ray tubes (CRT) are rather large and may be roughly square or rectangular with sizes 7 to 20 inches at each side, or larger. The weight of the panels is significant. A typical glass panel that is approximately 13 inches by 14 inches will weigh a little over a half pound. Simultaneous processing of 10 to 20 or more panels is regularly done. This means that a batch of 20 glass panels will weigh approximately 11 pounds.

Of course it is important, during the processing and multisteps of handling the glass substrates with the films or coatings deposited thereon, to handle the substrates carefully and in batches so that they may be easily transported from one work station to another and stored between process steps.

Carriers have been known in the past for handling silicon wafers in the manufacture of integrated circuit chips and such carriers are illustrated in numerous patents such as U.S. Pat. Nos. 3,961,877 and 4,471,716. Most such carriers are molded integrally in one piece and of heat resistant and chemical resistant materials such as perfluoroalkoxy otherwise known as Teflon PFA, which is a trademark of E. I. du Pont de Nemours & Company, Wilmington, Del. Other Teflon materials which are resistant to strong chemicals and heat include Teflon TFE which is not melt processible, but is compressed into a block and then machined to the desired shape. Certain carriers are made of cheaper plastics when not subjected to severe conditions; and there have been a few metal carriers fabricated with the use of screws connecting cast sidewall panels together with rods across the ends of the carriers to retain the sidewalls in predetermined relation to each other. Such metal carriers have been illustrated in U.S. Pat. No. 3,930,684.

There is a need for a large carrier for flat glass panels, other substrates and the like processed for use in flat panel displays that may be fabricated of a melt processible plastic that is machine automatable, has no or minimum contaminant and liquid traps, and has maximum structural strength and rigidity to minimize bending, bowing, twisting, warping and other distortions of the carrier during caustic and heated processing of the glass panels.

SUMMARY OF THE INVENTION

A strong and rigid carrier of substantial size fabricated of melt processible plastic for flat glass panels being processed for use in flat panel displays. The carrier has a pair of light weight but rigid and strong end walls in confronting and spaced relation to each other. Each end wall has a periphery thereabout and central ribs with an inclined panel adjoining the central ribs and traversing the height of the central ribs. Outwardly extending mounting flanges adjoin the periphery with a multiplicity of annular bosses protruding inwardly from the flanges. Large openings are in the end walls to allow machine and fluid processing access to the glass panels within the carrier. The carrier has a front open side and two sidewalls in confronting and spaced relation. The sidewalls each have a multiplicity of elongate sidewall segments each preferably being tubular and oblong in cross section or having portions which extend transversely and obliquely of the peripheries of each end wall. This construction further adds strength and rigidity to the carrier. The sidewall segments have end portions that extend to and are welded to the adjacent annular bosses of the adjacent end wall flanges. The side wall segments also have glass panel supporting and spacing ribs facing inwardly. A back wall is provided having a multiplicity of melt processible plastic tubular rails in spaced relation from each other, each extending between and welded to the adjacent annular bosses of the back wall flanges to confine the glass panels within the carrier.

A principal object and advantage of this invention is to provide a strong and rigid carrier of substantial size for glass plates and panels being processed for use in flat panel displays of a size comparable to the displays of CRT's used in television sets. The carrier is fabricated of a number of components which are readily molded of a fluoropolymer material, such as perfluoroalkoxy often times known as Teflon PFA, or other similar material that is resistent to the deleterious effects of harsh chemicals and high temperatures, commonly known in the processing of glass panels into flat panel displays.

Another object and advantage of the carrier is that its unique end walls and sidewalls are designed to maximize strength and rigidity for a carrier of its size and substantial openness so that minimal bending, bowing, twisting, warping and other distortions may occur during heated processing of the heavy glass panels supported and confined within the carrier.

Another object and advantage of the fabricated carrier is that it is uniquely designed to have the characteristics of a carrier which is integrally made of a one-piece construction. The carrier includes ornamental smooth butt welds and curved exterior surfaces which may be readily cleaned, rinsed or dried without any fear of entrapping contaminants, particulate material or processing chemicals that may be carried over from one processing step to another.

Another object and advantage of the present invention is that it is uniquely designed to be machine automatable for robotic handling and accurate indexing within or on equipment used during the processing of the glass panels.

Another object and advantage of the present invention is that its back and sidewall components may optionally have embedded therein stiffening inserts of quartz, stainless or other stiff material which will provide further strength and rigidity to the carrier.

DETAILED SPECIFICATION

Figure 1:
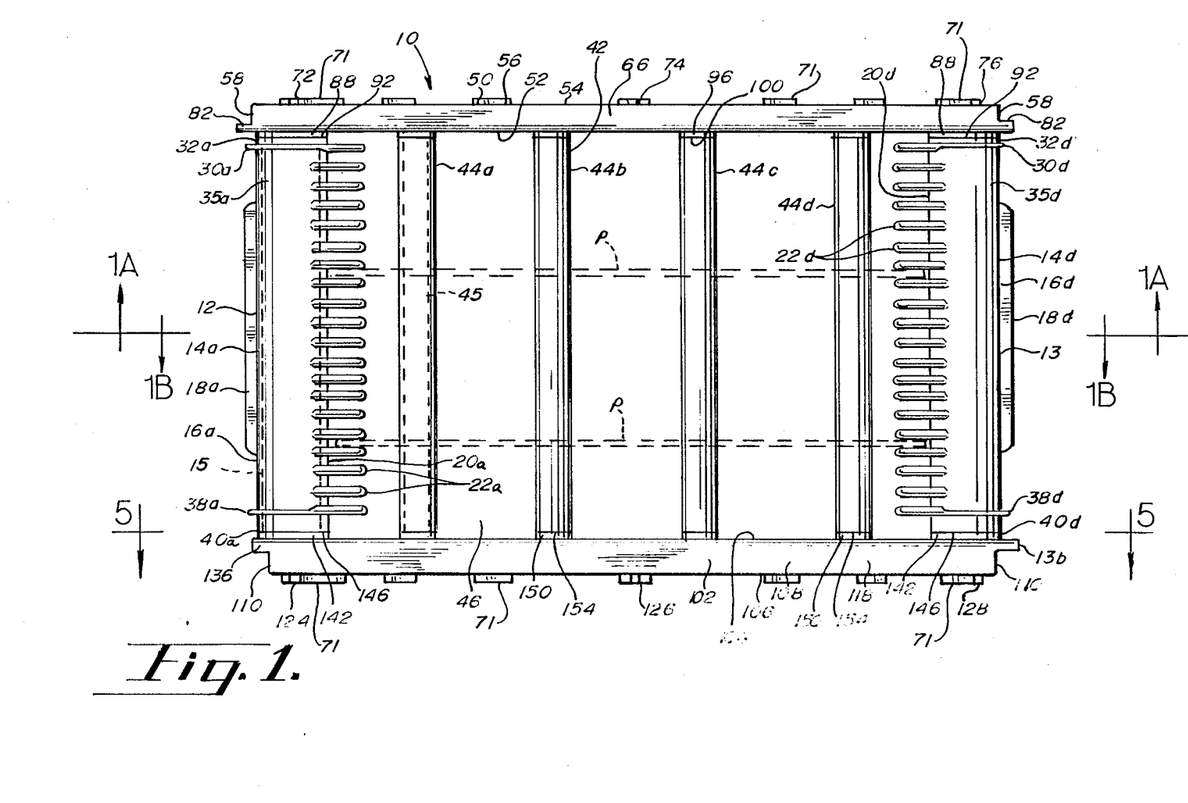
FIG. 1 is a front elevational view of the improved carrier looking into the open side illustrating in phantom lines a single glass panel P carried therein.
Figure 1A:
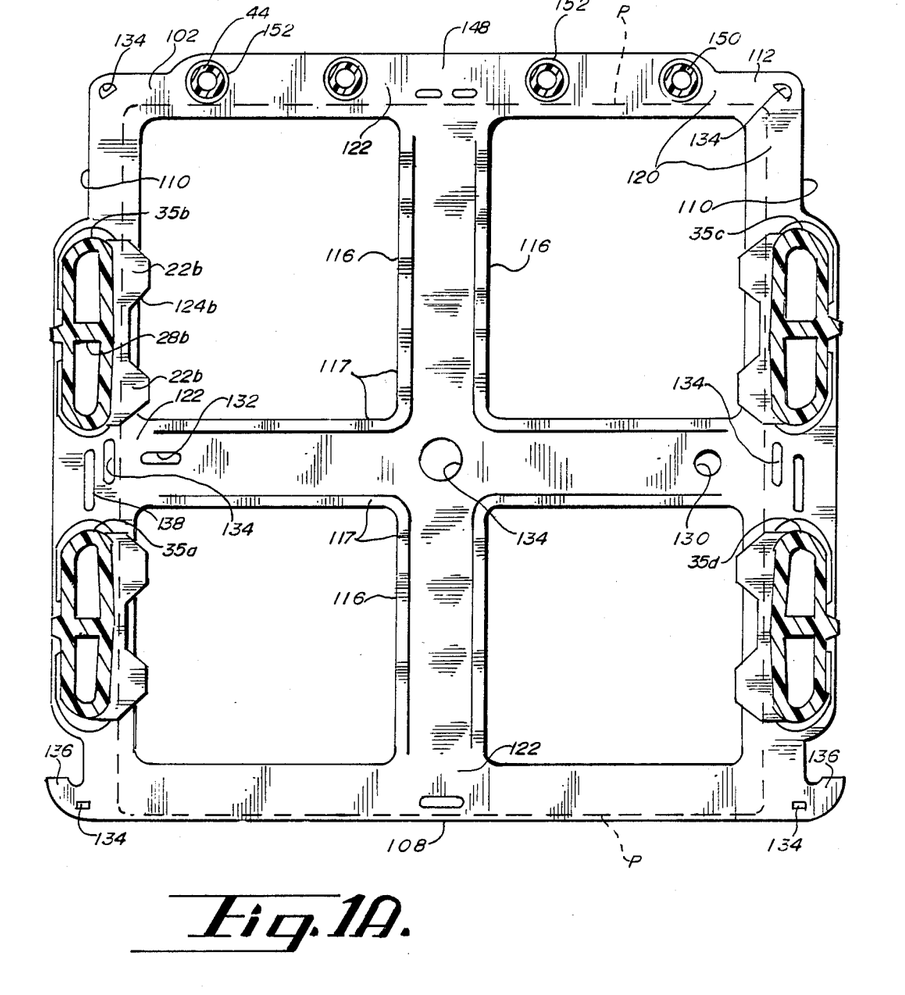
FIG. 1A is a view taken along lines 1A—1A of FIG. 1.
Figure 1B:
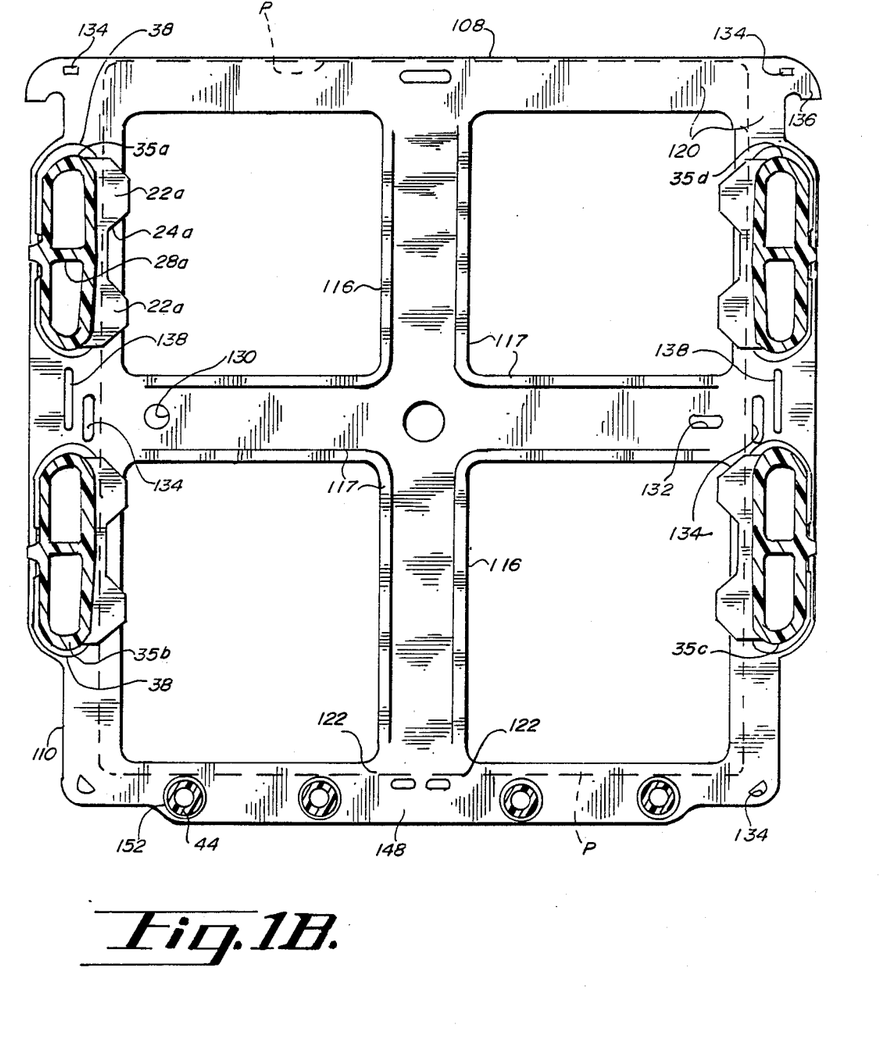
FIG. 1B is a view taken along lines 1B—1B of FIG. 1.
Figure 2:
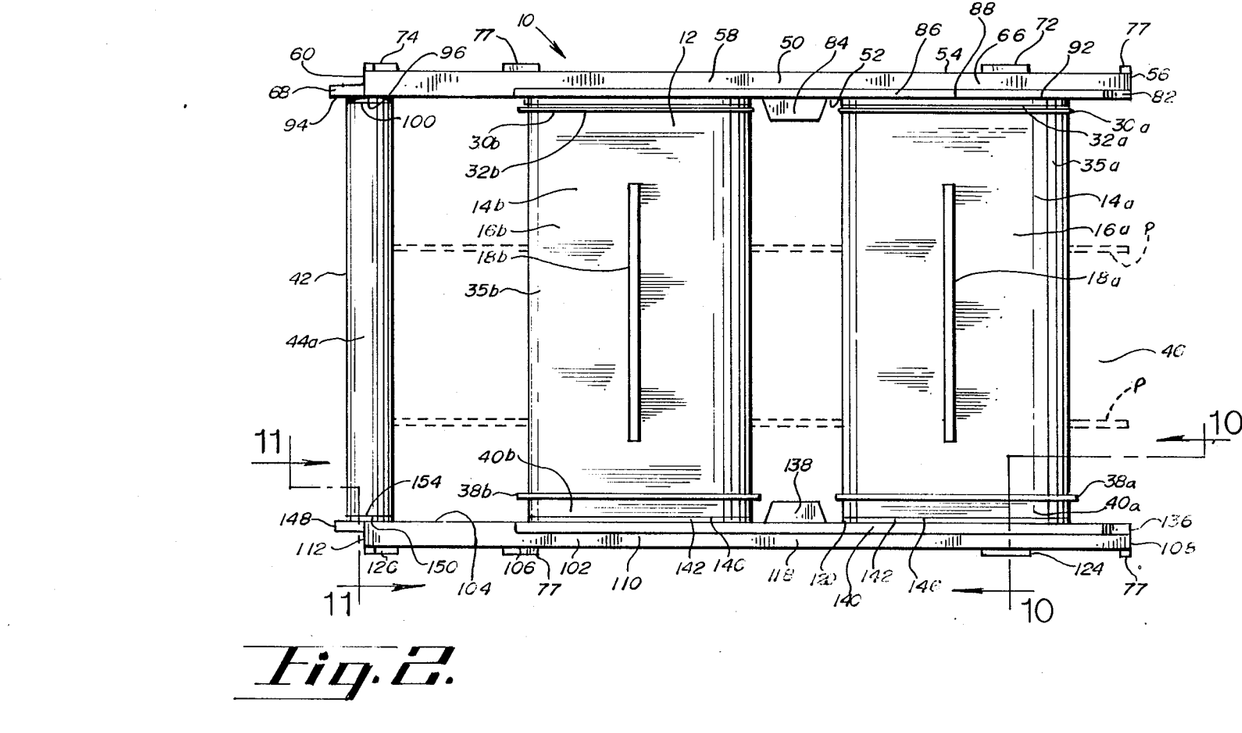
FIG. 2 is a side elevation view of the carrier.

Referring to FIGS. 1 and 2, the carrier 10 generally may be seen to include sidewalls 12 and 13, back wall 42, front open side 46, top end wall 50 and bottom end wall 102. Sidewalls 12 and 13 each have a multiplicity of sidewall segments each having inwardly extending ribs 22. The upper and lower ends 32, 40 form butt welds or joints 92 and 46, respectively, by welding to the sidewall mounting flanges 86 and 140, respectively. While the carrier 10 has an open front side 46, back wall 42 has a multiplicity of rails 44 which have their upper and lower ends welded to mounting flanges 94 and 148 thereby forming butt joints 100 and 154, respectively.

All of the components of the carrier 10 are molded of melt processible plastic capable of withstanding substantially high liquid temperatures and the deteriorating effects common with strong chemicals. Such a plastic may be a fluoropolymer plastic such as Teflon PFA.

Referring to FIGS. 1 and 2, and 7-9, the details of sidewalls 12 and 13 may specifically be seen and will now be explained. A multiplicity of integrally molded sidewall segments 14a, 14b, 14c and 14d, preferably identical, are used in the fabrication of the carrier 10. It should be recognized that the carrier 10 may be fabricated to incorporate various sizes of glass panels meaning that more or less sidewall segments 14 of equal height may be incorporated into carrier 10 to increase or decrease its overall size.

Figures 7, 10, 11:
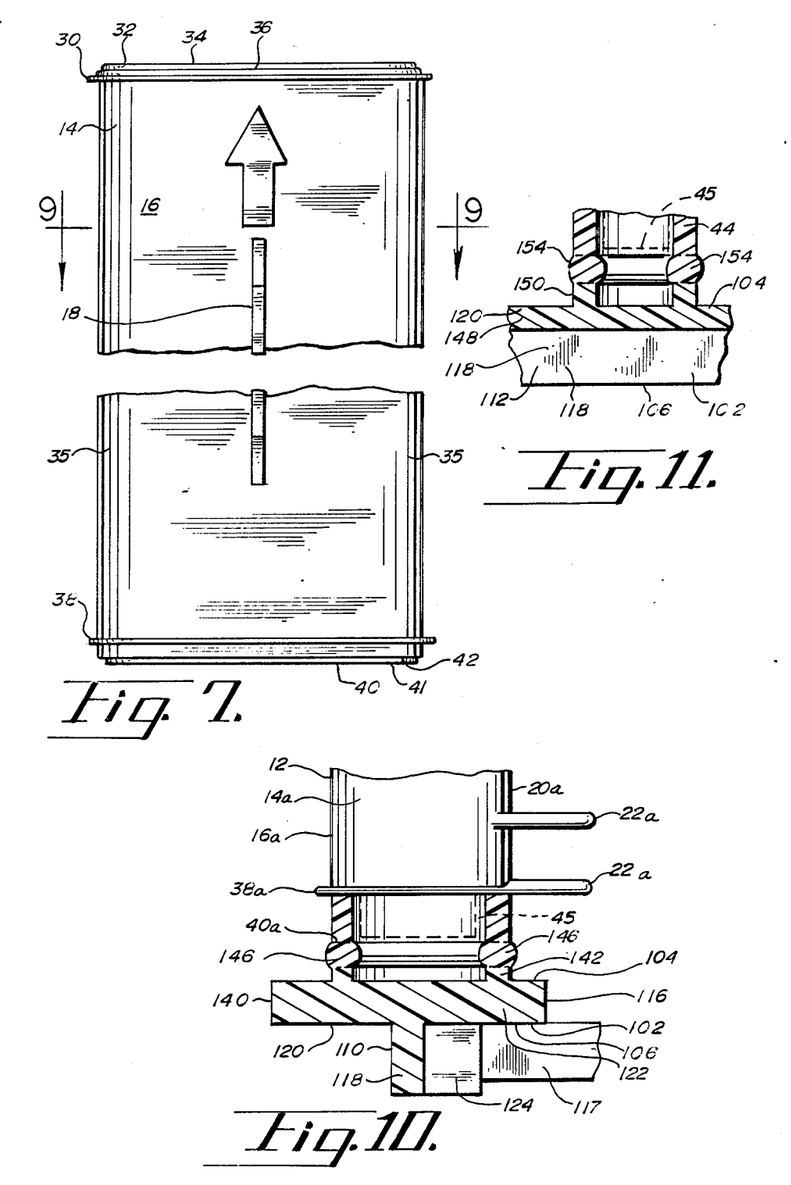
FIG. 7 is a side elevational view of a sidewall segment.
FIG. 10 is an enlarged detailed and cross sectional view taken along lines 10—10 of FIG. 2.
FIG. 11 is an enlarged detailed and sectional view taken along lines 11—11 of FIG. 2.
Figure 8:
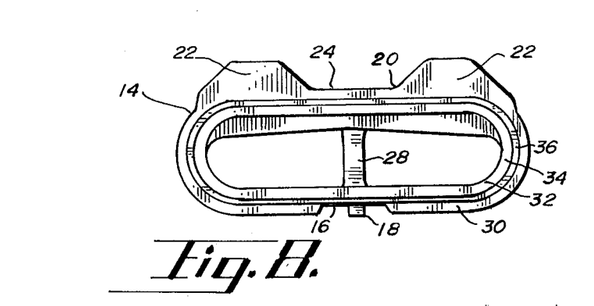
FIG. 8 is a top view of the sidewall segment of FIG. 7.
Figure 9:
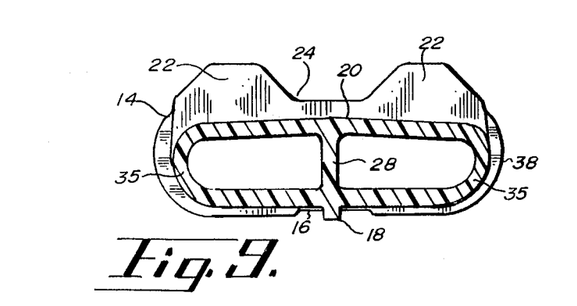
FIG. 9 is a detail cross sectional view of the sidewall segment taken along lines 9—9 of FIG. 7.

Sidewall segments 14 are somewhat ornamental and each has a smooth outer panel 16 with a centrally located indexing rib 18 for critically locating the carrier 10 within certain processing equipment, such as a centrifuge. Sidewall segments 14 also each have a somewhat convex inner panel 20 for guiding and engaging panels P and for added strength and rigidity to the segments 14. Inner panels 20 have inwardly extending panel supporting and spacing ribs 22 which are observed to be horizontally paired appropriately having a gap or space 24 between any pair of ribs 22 to minimize their contact with glass panels P.

Sidewall segments 14 preferably each have a curved or tubular cross section or have portions 35 which extend transversely and obliquely of the peripheries 56 and 58 of end walls 50 and 102. This unique and novel construction has been found to add rigidity, structural strength and distortion resistant character to the sidewall segments 14. The carrier 10 has been found to achieve greatest rigidity and strength by molding the sidewall segments 14 in a smooth tubular fashion that is elongate, eliptical or oblong in cross section. An interior rib 28 suitably extends across the interior of each sidewall segment 14 which further adds rigidity to the sidewall segments 14. By this construction arrangement, maximum structural rigidity and strength of sidewall segments 14 are achieved. Furthermore, the smooth tubular construction minimizes liquid and contaminant trapping by the sidewall segments 14 as the carrier 10 moves from one processing step to another.

Sidewall segments 14 each suitably have an upper web 30 located at the upper end portion 32 whereat an annular boss or rib 34 with an annular step 36 is located. A lower web 38 is also provided at lower end 40 which similarly has an annular boss 41 with an annular step 42 located thereat. Rigid inserts 15 appropriately may be embedded or inserted into one, some or all of the interior spaces of the sidewall segments 14 and appropriately may be made of quartz, stainless or the like which is not subject to the corrosive effects of strong chemicals. It may also be desirable to place multiple inserts 15 in one, some or all of the interior spaces of side segments 14 in a stacked arrangement.

Figure 12:
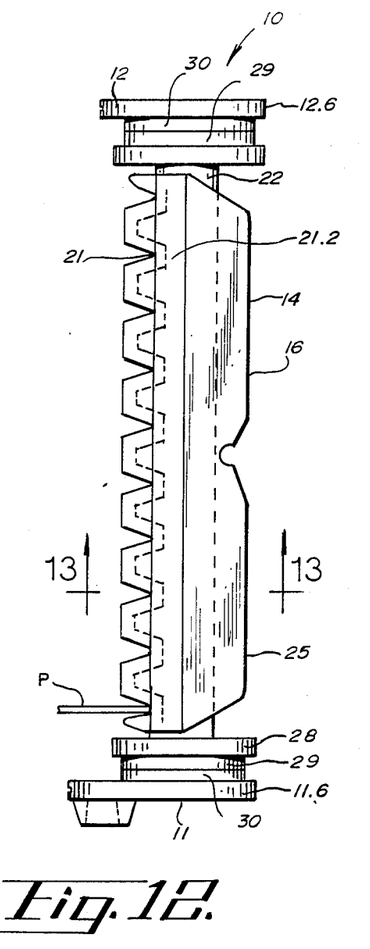
FIG. 12 is a detail elevational view of a modified form of the invention from FIG. 1 of the sidewall segment as enclosed in said copending application Ser. No. 102,166.
Figure 13:
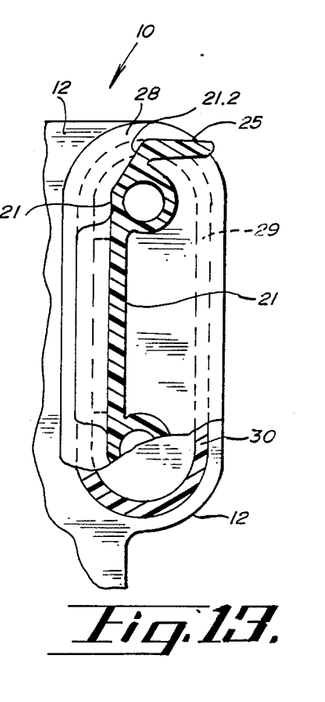
FIG. 13 is the detail sectional view taken along lines 13—13 of of FIG. 12 and having a portion broken away for clarity of detail.

Now referring to FIGS. 12 and 13 taken from U.S. Pat. application Ser. No. 102,166, carrier 10 has end walls 11 and 12 along with sidewall 14. Sidewall 14 is comprised of individual sidewall segments 16 comprised of an elongate panel 21 with oblique portions 21.2 and 25 which guide panels P into and out of the carrier 10 and against which the edges of the glass panels in the carrier may bear. The oblique portions 21.2 and 25 of sidewalls segment 16 extend transversely and obliquely of the peripheries 12.6 and 11.6 of the end walls 11 and 12. Rigid mounting panels 28 are integrally formed on the ends of sidewall segments 16 and are oblong or eliptical with annular bosses 29 located thereon. Similarly, end wall annular bosses 30 are located adjacent periphery 12.6 and 11.6 of the end walls 11 and 12. The annular bosses 29 and 30 are oriented in confronting relationship with each other for welding together thereby forming a butt joint. This construction has also been found to add rigidity and structural strength to the carrier 10.

Back wall 42 of the present invention may be comprised of sidewall sements 14 but preferably has a multiplicity of identical rails 44a, 44b, 44c and 44d suitably molded of smooth or ornamental tubes or Teflon PFA. The ends of the rails 44 suitably may or may not have annular bosses which obviously would be circular and may have an annular step to aid in their smooth welding in the fabrication of carrier 10. Similarly, rails 44 may have rigid inserts 45 embedded therein to further add rigidity to the carrier as the rails confine the panels P within the carrier 10.

Referring to FIGS. 1–6, the details of top end wall 50 and bottom end wall 102 will now be explained. The end walls 50 and 102 are suitably identical and substantially planar and rectangular being integrally molded of Teflon PFA to a smooth or ornamental appearance.

Figure 3:
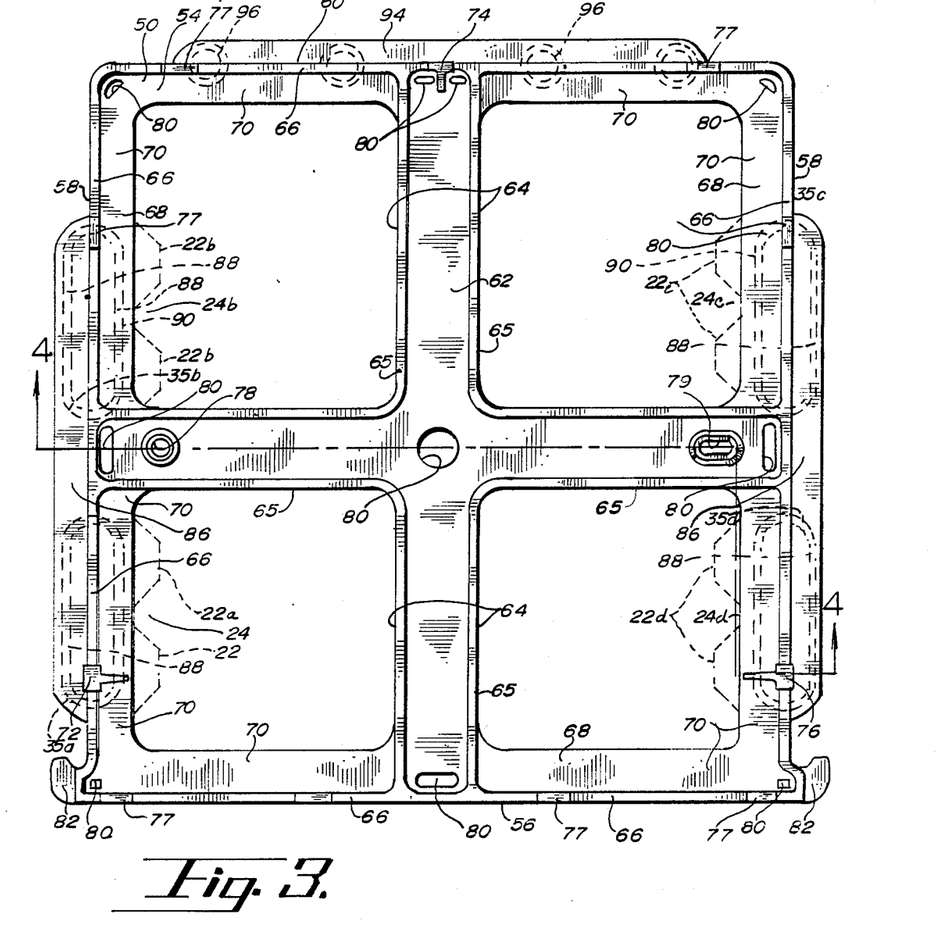
FIG. 3 is a top view of the top end wall of the carrier with portions of the glass panels supporting and spacing ribs in phantom lines.
Figure 4:
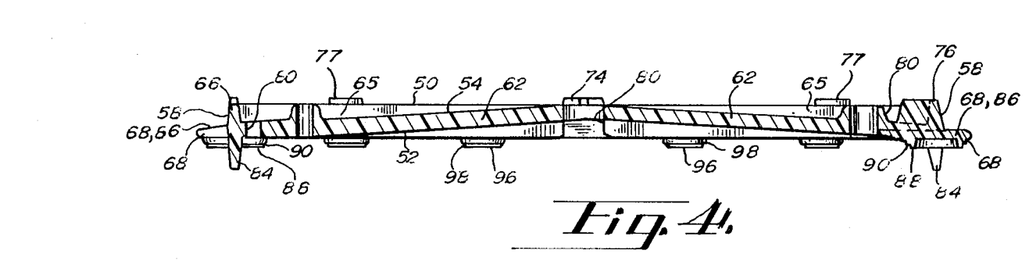
FIG. 4 is a view taken along lines 4—4 of FIG. 3.

The top end wall 52 has a carrier inner side 50 and a carrier outer side 54 along with front, sidewall, and back wall peripheries 56, 58 and 60. End wall inclined panel 62 rises upwardly from peripheries 56, 58 and 60 towards central drainage aperture 80. Inclined panel 62 is provided with a multiplicity of large rectangular openings 64 therein which suitably may be four in number. Openings 64 appropriately lighten the improved carrier 10 and permit access to the glass panels P by glass panel handling equipment as well as enhance fluid processing of the panels P by minimization of panel P shadowing by the carrier top end wall 50. Central ribs 65 are substantially in one plane, are along the perimeter of openings 64 and appropriately adjoin inclined panel 62 integrally therewith. Because ribs 65 are planar and panel 62 inclined, inclined panel 62 traverses the height of central ribs 65. It has been found that the oblique angularity between central ribs 65 and inclined panel 62 adds rigidity, strength and distortion resistant character to top end wall 50 by this unique and novel arrangement.

Peripheral rib 66 is located about the front, sidewall and back wall peripheries 56, 58 and 60 and has a web 68 adjoining the rib 66 on the carrier 10's inner side 52. Web 68 forms gussets 70 to add strength and rigidity to the top end wall 50. The carrier outer side 54 is adorned with T-shaped feet 72, 74 and 76 and straight feet 77 which essentially extend a common distance to permit the resting of the improved carrier 10 on a flat or planar surface. These feet constructions are unique in that fluid or particulate trappings are minimized by this construction. Registration or indexing apertures or openings 78 and 79 are appropriately located in top end wall 50 to permit exact indexing of the improved carrier 10 within certain processing equipment. Drainage apertures or openings 80 are provided to assure that all fluids used during the processing of the glass panels are appropriately drained away from the carrier 10 and panels P so that fluids are not carried to the next processing step. Robotic flanges 82 permit automated handling of the carrier 10 while ears 84 permit manual handling of the carrier 10 with assurance that fingers are kept from touching glass panels P as the improved carrier 10 is lifted by hands from the inner side 52 of the carrier adjacent ears 84.

Web 68 also forms sidewall mounting flanges 86 which extend along and below peripheral rib 66. On the inner side 52 of the flanges 86 are located a plurality or multiplicity of elongate, oblong or elliptical annular bosses which include annular steps 90 which are of a matching construction with the annular bosses 41 of sidewall segments 14. Back wall mounting flange 94 also similarly has a plurality or multiplicity of annular or circular bosses 96 with an annular step 98 which appropriately match the circular upper ends of the rails 44.

Although top end wall 50 and bottom end wall 102 are preferably identical, the features of bottom end wall 102 will now be detailed for ease of understanding of the present invention.

Figure 5:
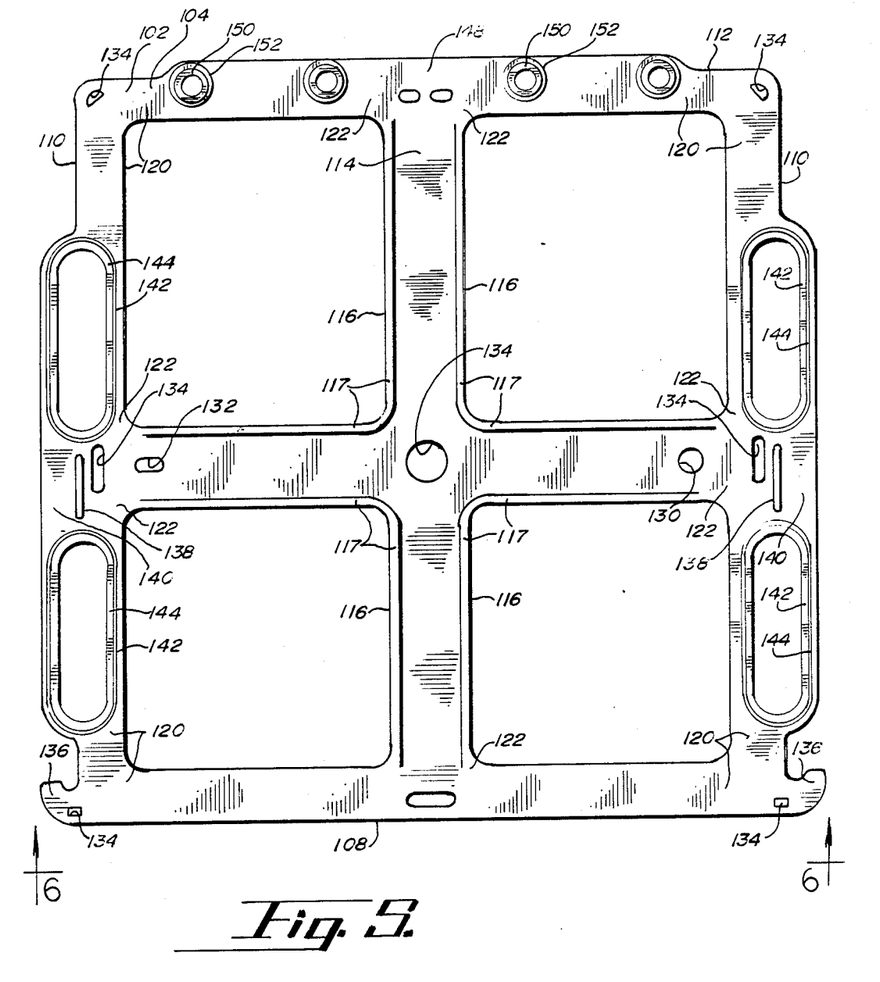
FIG. 5 is a top view of the bottom end wall taken along lines 5—5 of FIG. 1 before fabrication.
Figure 6:
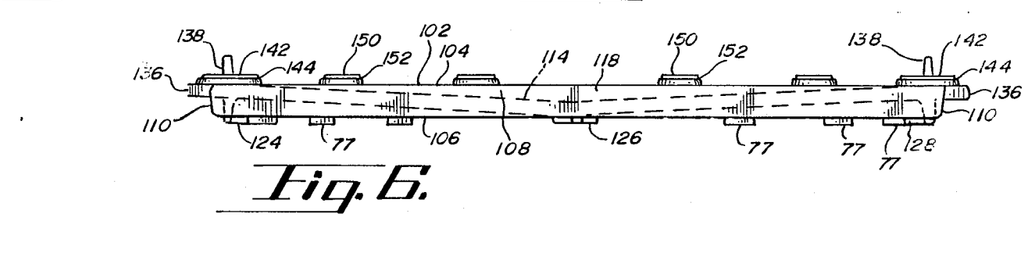
FIG. 6 is a view taken along 6—6 of FIG. 5.

Bottom end wall 102 has a carrier inner side 104 and a carrier outer side 106 along with front, sidewall and back wall peripheries 108, 110 and 112. End wall inclined panel 114 has large rectangular openings 116 adjacent to central ribs 117. Peripheral rib 118 has web 120 formed and adjoining rib 118 on the carrier's 10 inner side 104. Web 120 forms gussets 122. The T-shaped feet 124, 126 and 128 are also provided on the bottom end wall 102. Registration or indexing apertures 130 and 132 along with drainage apertures or openings 134 are located in the bottom end wall 102 as shown. Robotic flanges 136 provide automated handling while ears 138 prevent manual touching of the glass panels P during manual handling of the carrier 10.

Web 120 similarly forms sidewall mounting flanges 140 having a multiplicity of annular bosses 142 located on the carrier's inner side 104 and each have annular steps 144. Back wall mounting flange 148, formed by web 120, similarly has a multiplicity of annular or circular bosses 150 with annular steps 152 projecting upward on the carrier's inner side 104.

Referring to FIGS. 10 and 11, the fabrication of the carrier 10 and the welding of its component sidewall segments and back wall rails 44 with end walls 50 and 102 may more clearly be understood. Although butt joints 146 and 154 are shown, all butt joints or welds 91, 100, 146 and 154 are formed by the welding of the annular bosses of sidewall segments 14, rails 44 (if present) and flanges 86 and 94 thereby closing tubular sidewall segments 14. The welding is accomplished suitably by a contact heater, as is well known to persons of skill in the art, by applying a hot iron to the ends of the bosses until they are visibly molten and then moving the molten end faces of the bosses into contacting relation with each other without the need for pressure. Other welding methods, such as by radiant heat may also be utilized. Steps 36, 42, 90, 98, 144 and 152 are provided to permit the molten plastic to readily form smooth butt joints 92, 100, 146 and 154 which will advantageously not provide a location for the clinging of chemicals or particulates over to the next processing step thereby contaminating the processing of the glass panels P.

It is contemplated that the carrier 10 is useful in all different types storage, cleaning and of wet processing of large glass panels including processing in liquid bathes and also in processing by sprays, processing by equipment treatment and the like. The carrier 10 may rest on its top end wall 50, bottom end wall 102 or back wall 42. It should be recognized that sidewalls 12 and 13 and back wall 42 of the carrier 10 incorporate a multiplicity of sidewall segments 14 and rails 44 depending upon the size of the glass plates P being handled. The sidewall segments 14 and rails 44 are well spaced apart to accommodate thorough cleaning, rinsing and spraying of the glass panels while at the same time reducing the weight of the carrier to reasonable levels. It should also be understood that it is contemplated that the carrier 10 may be set up as to be adapted for handling glass plates of various sizes in the range of seven inches to 20 inches square and larger. Similarly, the height of elongate sidewall segments with inwardly extending glass supporting and spacing ribs 22 and confining back wall rails 44 directly depend upon the number of glass panels P to be placed into the improved carrier 10. Capacities of 10 to 20 glass panels should be anticipated.

The present invention may be embodied in other specific forms without departing from the spirit or essential attributes thereof; therefore, the illustrated embodiment should be considered in all respects as illustrative and not restrictive, reference being made to the appended claims rather than to the foregoing description to indicate the scope of the invention.

What is claimed is:

1. A strong and rigid carrier of substantial size for glass panels and the like being processed for use in panel displays, comprising:
    a pair of end walls with peripheries thereabout of melt processible plastic in confronting and spaced relation to each other; and
    two elongate sidewall segments of melt processible plastic extending between and to the end walls adjacent the peripheries thereof with glass panel supporting and spacing means extending inwardly and each segment having end portions extending to and affixed to both end walls with portions of the segments extending tranversely and obliquely of the adjacent periphery thereby adding strength and rigidity to the carrier and minimizing bending, bowing, twisting, warping and other distortions of the carrier during processing of the glass panels.

2. The carrier of claim 1 wherein the segments are curved in cross section with curved end portions affixed to both end walls.

3. The carrier of claim 1 wherein the end walls each have central ribs substantially one plane and an adjoining end wall inclined panel traversing the height of the ribs to add rigidity and strength to the end walls.

4. The carrier of claim 1, further comprising a rib about the periphery of each end wall with an adjoining web forming a mounting flange having an annular boss protruding therefrom and welded to the end portion of the adjacent sidewall segment.

5. The carrier of claim 1, wherein the sidewall segments are tubular between end portions, oblong in cross section and completely enclosed.

6. The carrier of claim 5, further comprising an interior rib traversing the interior of each sidewall segments.

7. The carrier of claim 1 wherein the two sidewall segments oppose each other and further comprising two additional sidewall segments extending between and affixed to the peripheries of the end walls and in spaced and opposing relation to the first two sidewall segments.

8. The carrier of claim 1, further comprising a robotic flange and two indexing apertures in each end wall for machine automatability and indexing.

9. The carrier of claim 1, further comprising a back wall including a melt processible plastic rail extending between and affixed to the peripheries of the end walls to confine the glass panels within the carrier.

10. The carrier of claim 9 wherein the rail is tubular.

11. The carrier of claim 1, wherein the melt processible plastic is perfluoroalkoxy.

12. The carrier of claim 1 wherein the end walls have three feet that are T-shaped in cross section.

13. The carrier of claim 1 wherein the end walls have large openings therein to allow access to the glass panels by handling equipment and to enhance fluid processing by minimizing end wall shadowing.

14. The carrier of claim 3, further comprising processing fluid drainage apertures in the inclined panel.

15. The carrier of claim 1, wherein the glass panel supporting and spacing means comprises inwardly extending and spaced apart ribs.

16. The carrier of claim 5, further comprising at least one rigid insert in one of the sidewall segments to further add rigidity to the carrier and further minimize bending, bowing, twisting, warping and other distortions of the carrier during processing.

17. The carrier of claim 10, further comprising at least one rigid insert in one of the tubular rails to further add rigidity to the carrier and further minimize bending, bowing, twisting and other distortions of the carrier during processing of the glass panels.

18. A rigid carrier of substantial size for flat glass panels and other substrates of the type for use in flat panel displays, comprising
    a pair of end walls with peripheries thereabout of melt processible plastic in confronting and spaced relation to each other;
    a multiplicity of elongate sidewall segments of melt processible plastic in spaced relation from each other, the segments extending between and to the adjacent end walls with glass panel supporting and spacing means extending inwardly, each sidewall segment being tubular with end portions extending to and welded to the adjacent end wall periphery; and
    large opening in the end walls to allow access to the glass panels by glass panel handling equipment and to enhance fluid processing by minimizing end wall shadowing.

19. The fabricated carrier of claim 18 wherein the end walls each have central ribs substantially in one plane and an adjoining inclined panel traversing the height of the ribs to add rigidity and strength to the end walls.

20. The carrier of claim 18, further comprising a rib about the periphery of each end wall with a web adjoining therebelow forming a mounting flange having an two annular boss protruding therefrom and welded to the end portion of the adjacent sidewalls segment.

21. The carrier of claim 18, wherein the sidewall segments are tubular between end portions, closed by the welding to the adjacent periphery and oblong in cross section.

22. The carrier of claim 21, further comprising an interior rib traversing the interior of the sidewall segments.

23. The carrier of claim 18 wherein the two sidewall segments oppose each other and further comprising two additional and opposing sidewall segments extending between and affixed to the peripheries of the end walls and in spaced and opposing relation to the first two sidewall segments.

24. The carrier of claim 18, further comprising a robotic flange and two indexing apertures in each end wall for machine automatability.

25. The carrier of claim 18, further comprising a back wall including a melt processible plastic rail extending between and welded to the end walls to confine the glass panels within the carrier.

26. The carrier of claim 25 wherein the rail is tubular.

27. The carrier of claim 18, wherein the melt processible plastic is perfluoroalkoxy.

28. The carrier of claim 18 wherein the end walls have three feet that are T-shaped in cross section.

29. The carrier of claim 19, further comprising processing fluid drainage apertures in the inclined panel.

30. The carrier of claim 17, wherein the glass panel supporting and spacing means comprises inwardly extending and spaced apart ribs.

31. The carrier of claim 21, further comprising a rigid insert in one of the sidewall segments to further add rigidity to the carrier and further minimize bending, bowing, twisting and other distortions of the carrier during processing.

32. The carrier of claim 26, further comprising a rigid insert in one of the tubular rails to further add rigidity to the carrier and further minimize bending, bowing, twisting, warping and other distortions of the carrier during processing of the glass panels.

33. An strong and rigid fabricated carrier of substantial size for flat glass panels, other substrates and the like for use in the manufacture of flat panel displays, comprising:

a pair of end walls of melt processible plastic in confronting and spaced relation to each other each having central and peripheral ribs in one plane and an inclined end wall panel adjoining the central ribs and traversing the height of the central ribs to add strength and rigidity to the end walls, and further having two sidewall and one back wall mounting flanges adjoining the peripheral rib and extending outwardly with a multiplicity of annular bosses protruding inwardly from the flanges;

a multiplicity of elongate sidewall segments of melt processible plastic in spaced relation from each other extending between and to the end walls adjacent the peripheries thereof with inwardly extending glass panel supporting and spacing means, the segments being tubular and oblong in cross section with end portions extending to and welded to the adjacent annular boss of the adjacent sidewall flange thereby enclosing the segments;

a back wall including a multiplicity of melt processible plastic tubular rails in spaced relation from each other, each extending between and welded to the adjacent annular boss of the adjacent back wall flange to confine the glass panels within the carrier and to enclose the tubular rails; and large openings in the end walls to allow access to the glass panels by glass panel handling equipment and to enhance fluid processing by minimizing end wall shadowing.

* * * * *